(12) United States Patent
Zhu et al.

(10) Patent No.: US 11,393,726 B2
(45) Date of Patent: *Jul. 19, 2022

(54) METAL GATE STRUCTURE OF A CMOS SEMICONDUCTOR DEVICE AND METHOD OF FORMING THE SAME

(71) Applicant: TAIWAN SEMICONDUCTOR MANUFACTURING COMPANY, LTD., Hsinchu (TW)

(72) Inventors: Ming Zhu, Hsinchu (TW); Bao-Ru Young, Hsinchu (TW); Harry Hak-Lay Chuang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/098,927

(22) Filed: Nov. 16, 2020

(65) Prior Publication Data

US 2021/0082772 A1 Mar. 18, 2021

Related U.S. Application Data

(60) Continuation of application No. 15/356,736, filed on Nov. 21, 2016, now Pat. No. 10,840,149, which is a
(Continued)

(51) Int. Cl.
*H01L 21/8238* (2006.01)
*H01L 27/092* (2006.01)
(Continued)

(52) U.S. Cl.
CPC .. *H01L 21/823814* (2013.01); *H01L 21/3212* (2013.01); *H01L 21/82385* (2013.01);
(Continued)

(58) Field of Classification Search
CPC ......... H01L 21/823814; H01L 21/3212; H01L 21/82385; H01L 21/823864;
(Continued)

(56) References Cited

U.S. PATENT DOCUMENTS 4,559,694 A 12/1985 Yoh
4,841,349 A 6/1989 Nakano
(Continued)

FOREIGN PATENT DOCUMENTS

CN 101819976 9/2010
CN 102034758 4/2011
(Continued)

OTHER PUBLICATIONS

Office Action dated Jun. 12, 2014 from corresponding application No. TW100136014.
(Continued)

*Primary Examiner* — Christine A Enad
(74) *Attorney, Agent, or Firm* — Hauptman Ham, LLP

(57) ABSTRACT

A semiconductor device includes a substrate with an isolation region surrounding a P-active region and an N-active region, a first gate electrode comprising a first metal composition over the N-active region, and a second gate electrode with a center portion over the P-active region and an endcap portion over the isolation region. The endcap portion includes a first metal composition, and the center portion includes a second metal composition different from the first metal composition, and the center portion and the endcap portion do not overlap. An inner sidewall of the endcap portion is substantially aligned with a sidewall of the isolation region.

20 Claims, 9 Drawing Sheets

Related U.S. Application Data continuation of application No. 14/733,038, filed on Jun. 8, 2015, now Pat. No. 9,508,721, which is a division of application No. 13/189,232, filed on Jul. 22, 2011, now Pat. No. 9,070,784.

(51) Int. Cl.
*H01L 29/06* (2006.01)
*H01L 21/321* (2006.01)

(52) U.S. Cl.
CPC ............... *H01L 21/823864* (2013.01); *H01L 21/823878* (2013.01); *H01L 27/0922* (2013.01); *H01L 27/0928* (2013.01); *H01L 29/0642* (2013.01)

(58) Field of Classification Search
CPC ......... H01L 21/823878; H01L 27/0922; H01L 27/0928; H01L 29/0642
See application file for complete search history.

(56) References Cited

U.S. PATENT DOCUMENTS

| | | | |
|---|---|---|---|
| 5,091,763 A | 2/1992 | Sanchez | |
| 5,792,703 A | 8/1998 | Bronner | |
| 5,844,272 A | 12/1998 | Soderbarg | |
| 5,965,926 A | 10/1999 | Schwalke | |
| 6,004,841 A | 12/1999 | Chang | |
| 6,034,388 A | 3/2000 | Brown | |
| 6,091,118 A | 7/2000 | Duane | |
| 6,187,657 B1 | 2/2001 | Xiang | |
| 6,200,866 B1 | 3/2001 | Ma | |
| 6,228,714 B1 | 5/2001 | Choi | |
| 6,255,698 B1 | 7/2001 | Gardner | |
| 6,277,682 B1 | 8/2001 | Misium | |
| 6,281,052 B1 | 8/2001 | Shinmura | |
| 6,312,995 B1 | 11/2001 | Yu | |
| 6,333,223 B1 | 12/2001 | Moriwaki | |
| 6,406,987 B1 | 6/2002 | Huang | |
| 6,420,754 B2 | 7/2002 | Takahashi | |
| 6,563,178 B2 | 5/2003 | Moriwaki | |
| 6,653,698 B2 | 11/2003 | Lee | |
| 6,696,328 B2 | 2/2004 | Rhee | |
| 6,744,101 B2 | 6/2004 | Long | |
| 6,794,281 B2 | 9/2004 | Madhukar | |
| 6,876,035 B2 | 4/2005 | Abadeer | |
| 6,894,353 B2 | 5/2005 | Samavedam | |
| 6,900,088 B2 | 5/2005 | Nanjo | |
| 7,067,365 B1 | 6/2006 | Lee | |
| 7,285,829 B2 | 10/2007 | Doyle | |
| 7,316,949 B2 | 1/2008 | Doczy | |
| 7,563,701 B2 | 7/2009 | Chang | |
| 7,642,153 B2 * | 1/2010 | Pas ................. | H01L 21/823835 438/230 |
| 7,663,237 B2 * | 2/2010 | Peng .................... | H01L 29/495 257/750 |
| 7,838,356 B2 | 11/2010 | Kirkpatrick | |
| 8,110,465 B2 * | 2/2012 | Zhu .................. | H01L 21/28105 438/267 |
| 8,735,983 B2 | 5/2014 | Liu | |
| 8,816,440 B2 | 8/2014 | Maeda | |
| 9,508,721 B2 * | 11/2016 | Zhu ..................... | H01L 21/3212 |
| 9,580,601 B2 | 2/2017 | Li et al. | |
| 2001/0017390 A1 | 8/2001 | Long | |
| 2003/0040158 A1 | 2/2003 | Saitoh | |
| 2005/0141281 A1 | 6/2005 | Jung | |
| 2005/0148131 A1 | 7/2005 | Brask | |
| 2006/0022277 A1 | 2/2006 | Kavalieros | |
| 2007/0284671 A1 | 12/2007 | Tsutsumi et al. | |
| 2008/0128767 A1 | 6/2008 | Adkisson | |
| 2009/0189223 A1 | 7/2009 | Anderson et al. | |
| 2010/0048011 A1 | 2/2010 | Yeh et al. | |
| 2010/0048013 A1 | 2/2010 | Thei | |
| 2010/0052067 A1 | 3/2010 | Hsu | |
| 2010/0059827 A1 | 3/2010 | Oosuak et al. | |
| 2010/0255670 A1 | 10/2010 | Onda | |
| 2011/0039385 A1 * | 2/2011 | Shimamoto ....... | H01L 29/42344 438/287 |

FOREIGN PATENT DOCUMENTS

| | | |
|---|---|---|
| JP | 2008021903 | 1/2008 |
| KR | 20110064477 | 6/2011 |
| KR | 20110095116 | 8/2011 |

OTHER PUBLICATIONS

Office Action dated Mar. 28, 2013 and English translation from corresponding application No. KR 10-2012-0036151.

Notice of Allowance dated Sep. 12, 2013 and English translation from corresponding application No. KR 10-2012-0036151.

* cited by examiner

US 11,393,726 B2

METAL GATE STRUCTURE OF A CMOS SEMICONDUCTOR DEVICE AND METHOD OF FORMING THE SAME

PRIORITY CLAIM

This application is a continuation of U.S. application Ser. No. 15/356,736, filed Nov. 21, 2016, now U.S. Pat. No. 10,840,149, issued Nov. 17, 2020, which is a continuation of U.S. application Ser. No. 14/733,038, filed Jun. 8, 2015, now U.S. Pat. No. 9,508,721, issued Nov. 29, 2016, which is a divisional of U.S. application Ser. No. 13/189,232, filed Jul. 22, 2011, now U.S. Pat. No. 9,070,784, issued Jun. 30, 2015, which are incorporated herein by reference in their entireties.

FIELD

The disclosure relates to integrated circuit fabrication and, more particularly, to a metal gate structure.

BACKGROUND

As the technology nodes shrink, in some integrated circuit (IC) designs, polysilicon gate electrodes are replaced by metal gate electrodes to improve device performance with the decreased feature sizes. One process of forming a metal gate structure is termed a "gate last" process in which the final gate structure is fabricated "last" which allows for reduced number of subsequent processes, including high temperature processing, that must be performed after formation of the gate.

However, there are challenges to implement such features and processes in complementary metal-oxide-semiconductor (CMOS) fabrication. As the gate length and spacing between devices decrease, these problems are exacerbated. For example, in a "gate last" fabrication process, it is difficult to achieve a perfect isolation between neighboring transistors because unwanted recesses are generated in an inter-layer dielectric (ILD) layer after wet/dry etching a dummy strip. The recesses present in the ILD layer can become a receptacle of metals during subsequent processing thereby increasing the likelihood of electrical shorting and/or device failure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features in the drawings may be arbitrarily increased or reduced for clarity of discussion.

DETAILED DESCRIPTION

Figure 1:
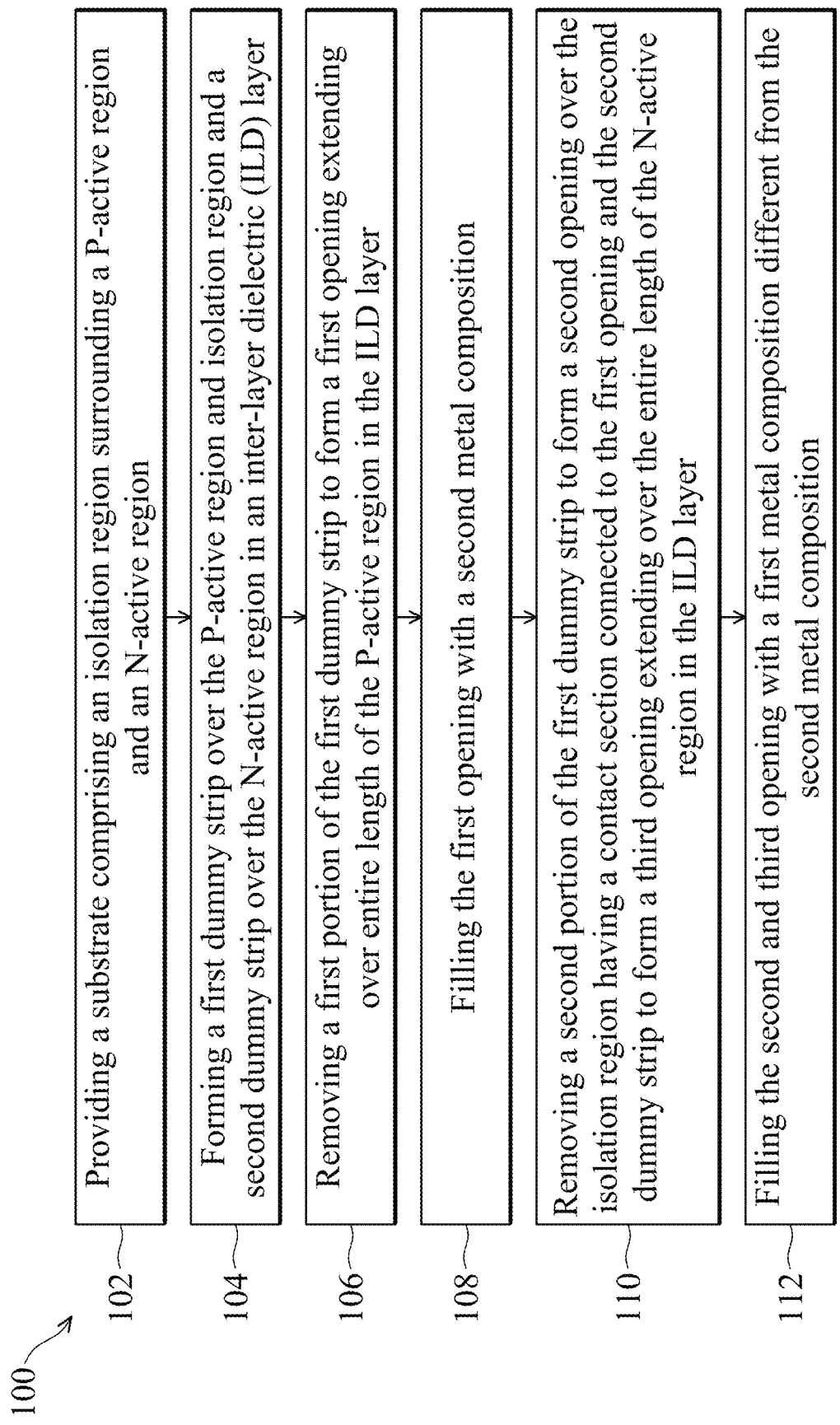
FIG. 1 is a flowchart of a method of fabricating a CMOS semiconductor device comprising a metal gate structure according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. Further, the present disclosure may repeat reference numerals and/or letters in the various examples. This repetition is for the purpose of simplicity and clarity and does not in itself dictate a relationship between the various embodiments and/or configurations discussed. In addition, the present disclosure provides examples of a "gate last" metal gate process, however, one skilled in the art may recognize applicability to other processes and/or use of other materials.

Figure 2:
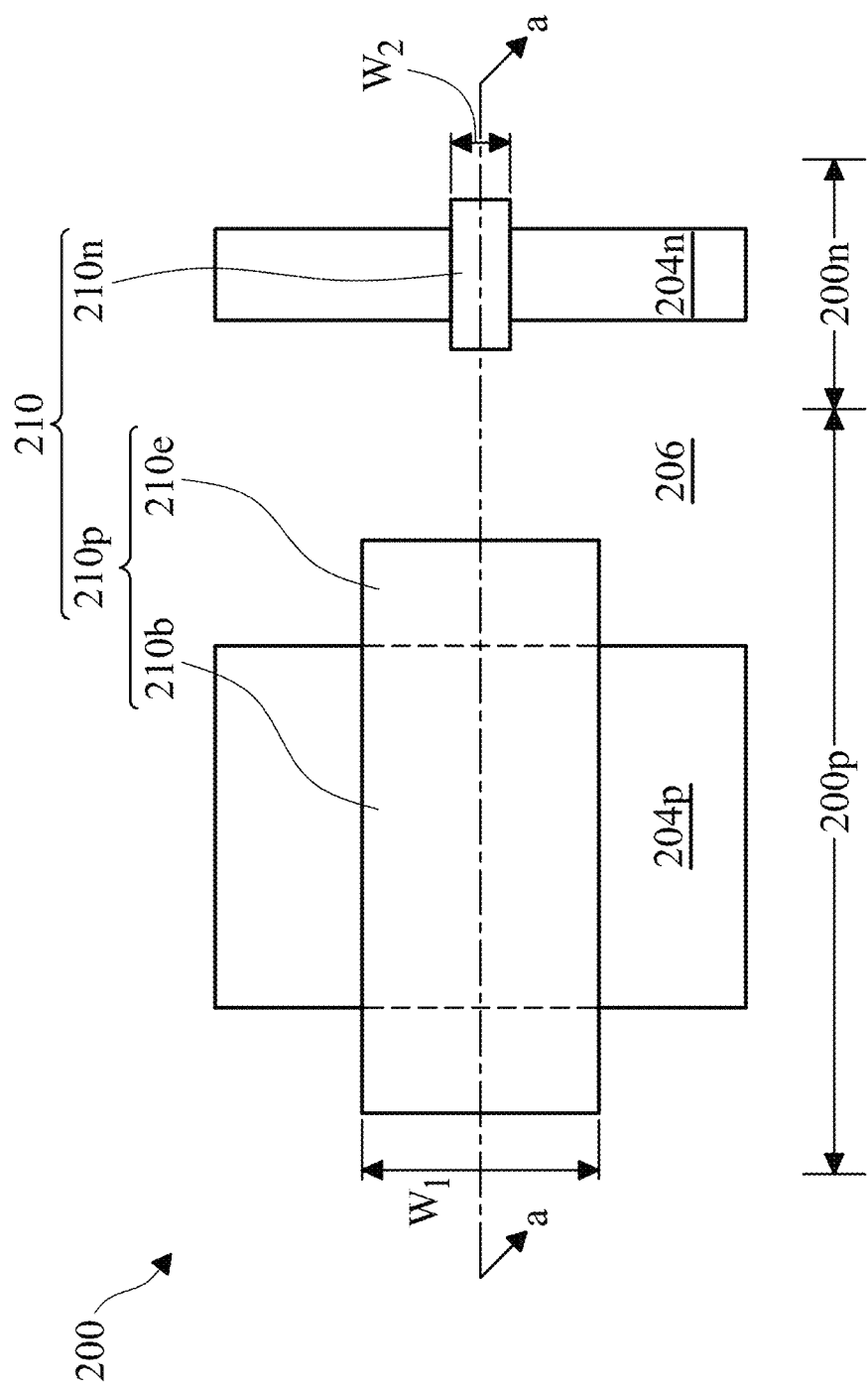
FIG. 2 is a top view of a CMOS semiconductor device comprising a metal gate structure according to various aspects of the present disclosure.

FIG. 1 is a flowchart of a method 100 of fabricating a complementary metal-oxide-semiconductor (CMOS) semiconductor device 200 comprising a metal gate structure 210 (shown in FIG. 2) according to various aspects of the present disclosure. FIG. 2 is a top view of a CMOS semiconductor device 200 comprising a metal gate structure 210 according to various aspects of the present disclosure; and FIGS. 3A-3F are cross-section views of a CMOS semiconductor device 200 taken along the line a-a of FIG. 2 at various stages of fabrication according to various aspects of the present disclosure. It is noted that part of the CMOS semiconductor device 200 may be fabricated with CMOS technology processing. Accordingly, it is understood that additional processes may be provided before, during, and/or after the method 100 of FIG. 1, and that some other processes may only be briefly described herein. Also, FIGS. 1 through 3F are simplified for a better understanding of the present disclosure. For example, although the figures illustrate a metal gate structure 210 for the CMOS semiconductor device 200, it is understood the CMOS semiconductor device 200 may be part of an integrated circuit (IC) that may comprise a number of other devices comprising resistors, capacitors, inductors, fuses, etc.

FIG. 2 is a top view of a CMOS semiconductor device 200 comprising a metal gate structure 210 fabricated by a "gate last" process. A substrate 202 (shown in FIG. 3A) comprising an isolation region 206 surrounding a P-active region 204$p$ and an N-active region 204$n$ is provided. The CMOS semiconductor device 200 comprises a p-type metal oxide semiconductor field effect transistor (pMOSFET) 200$p$ and an n-type metal oxide semiconductor field effect transistor (nMOSFET) 200$n$.

The nMOSFET 200$n$ is formed from an N-metal gate electrode 210$n$ comprising a first metal composition 210$f$ over the N-active region 204$n$. In one embodiment, the first metal composition 210$f$ may comprise an N-work-function metal. In some embodiment, the N-work-function metal comprises Ti, Ag, Al, TiAl, TiAlN, TaC, TaCN, TaSiN, Mn, or Zr. In the present embodiment, the N-metal gate electrode 210n over the N-active region 204n has a second width $W_2$ in the range of about 10 to 30 nm and extends outside of the N-active region 204n over the isolation regions 206.

The pMOSFET 200p is formed from a P-metal gate electrode 210p comprising a bulk portion 210b over the P-active region 204p and an endcap portion 210e over the isolation region 206, wherein the endcap portion 210e comprises the first metal composition 210f and the bulk portion 210b comprises a second metal composition 210s different from the first metal composition 210f. In at least one embodiment, the second metal composition 210s may comprise a P-work-function metal. In some embodiment, the P-work-function metal comprises TiN, WN, TaN, or Ru. In the present embodiment, the P-metal gate electrode 210p over the P-active region 204p has a first width $W_1$ in the range of about 500 to 1000 nm, so that the first width $W_1$ of the P-metal gate electrode 210p is greater than the second width $W_2$ of the N-metal gate electrode 210n. In at least one embodiment, a ratio of the first width $W_1$ to the second width $W_2$ is from about 18 to 30. The P-metal gate electrode 210p and N-metal gate electrode 210n are combined and hereinafter referred to as a metal gate structure 210.

Figure 3A:
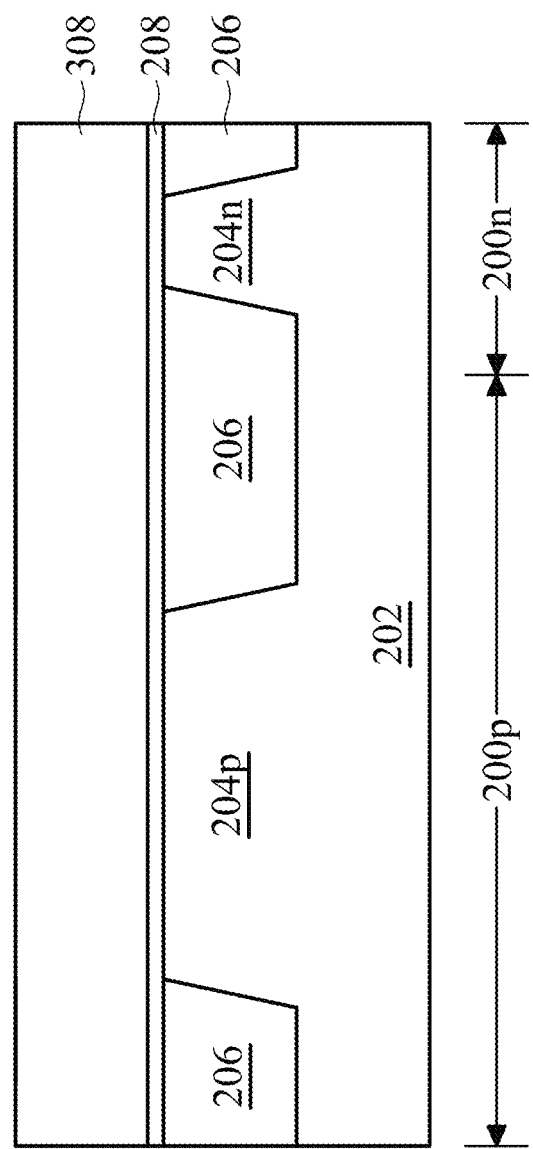
FIGS. 3A-3F are cross-section views of a CMOS semiconductor device taken along the line a-a of FIG. 2 at various stages of fabrication according to various aspects of the present disclosure.

Referring to FIGS. 1 and 3A, the method 100 begins at step 102 wherein a substrate 202 comprising the isolation region 206 surrounding the P-active region 204p and N-active region 204n is provided. The substrate 202 may comprise a silicon substrate. The substrate 202 may alternatively comprise silicon germanium, gallium arsenic, or other suitable semiconductor materials. The substrate 202 may further comprise other features such as various doped regions, a buried layer, and/or an epitaxy layer. Furthermore, the substrate 202 may be a semiconductor on insulator such as silicon on insulator (SOI). In other embodiments, the semiconductor substrate 202 may comprise a doped epi layer, a gradient semiconductor layer, and/or may further include a semiconductor layer overlying another semiconductor layer of a different type such as a silicon layer on a silicon germanium layer. In other examples, a compound semiconductor substrate may comprise a multilayer silicon structure or a silicon substrate may include a multilayer compound semiconductor structure.

In the present embodiments, the semiconductor substrate 202 may comprise the isolation region 206 surrounding the P-active region 204p for the pMOSFET 200p and N-active region 204n for the nMOSFET 200n. The active regions 204p, 204n may include various doping configurations depending on design requirements. For example, the P-active region 204p is doped with n-type dopants, such as phosphorus or arsenic; the N-active region 204n is doped with p-type dopants, such as boron or $BF_2$.

Isolation regions 206 may be formed on the substrate 202 to isolate the various active regions 204p, 204n from each other. The isolation regions 206 may utilize isolation technology, such as local oxidation of silicon (LOCOS) or shallow trench isolation (STI), to define and electrically isolate the various active regions 204p, 204n. In the present embodiment, the isolation region 206 comprises a STI. The isolation regions 206 may comprise materials such as silicon oxide, silicon nitride, silicon oxynitride, fluoride-doped silicate glass (FSG), a low dielectric constant (low-k) dielectric material, and/or combinations thereof. The isolation regions 206, and in the present embodiment, the STI, may be formed by any suitable process. As one example, the formation of the STI may include patterning the semiconductor substrate 202 by a photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIG. 3A, a gate dielectric layer 208 may be formed over the substrate 202. In some embodiments, the gate dielectric layer 208 may comprise silicon oxide, silicon nitride, silicon oxy-nitride, or high dielectric constant (high-k) dielectric. High-k dielectrics comprise certain metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or mixtures thereof. In the present embodiment, the gate dielectric layer 208 is a high-k dielectric layer comprising $HfO_x$ with a thickness in the range of about 10 to 30 angstroms. The gate dielectric layer 208 may be formed using a suitable process such as atomic layer deposition (ALD), chemical vapor deposition (CVD), physical vapor deposition (PVD), thermal oxidation, ultraviolet (UV)-ozone oxidation, or combinations thereof. The gate dielectric layer 208 may further comprise an interfacial layer (not shown) to reduce damage between the gate dielectric layer 208 and the substrate 202. The interfacial layer may comprise silicon oxide.

In a gate last process, a dummy gate electrode layer 308 is subsequently formed over the gate dielectric layer 208. In some embodiments, the dummy gate electrode layer 308 may comprise a single layer or multilayer structure. In the present embodiment, the dummy gate electrode layer 308 may comprise poly-silicon. Further, the dummy gate electrode layer 308 may be doped poly-silicon with the uniform or gradient doping. The dummy gate electrode layer 308 may have a thickness in the range of about 30 nm to about 60 nm. The dummy electrode layer 308 may be formed using a low-pressure chemical vapor deposition (LPCVD) process. In at least one embodiment, the LPCVD process can be carried out in a standard LPCVD furnace at a temperature of about 580° C. to 650° C., and at a pressure of about 200 mTorr to 1 Torr, using silane ($SiH_4$) or dichlorosilane ($SiH_2Cl_2$) as the silicon source gas.

Figure 3B:
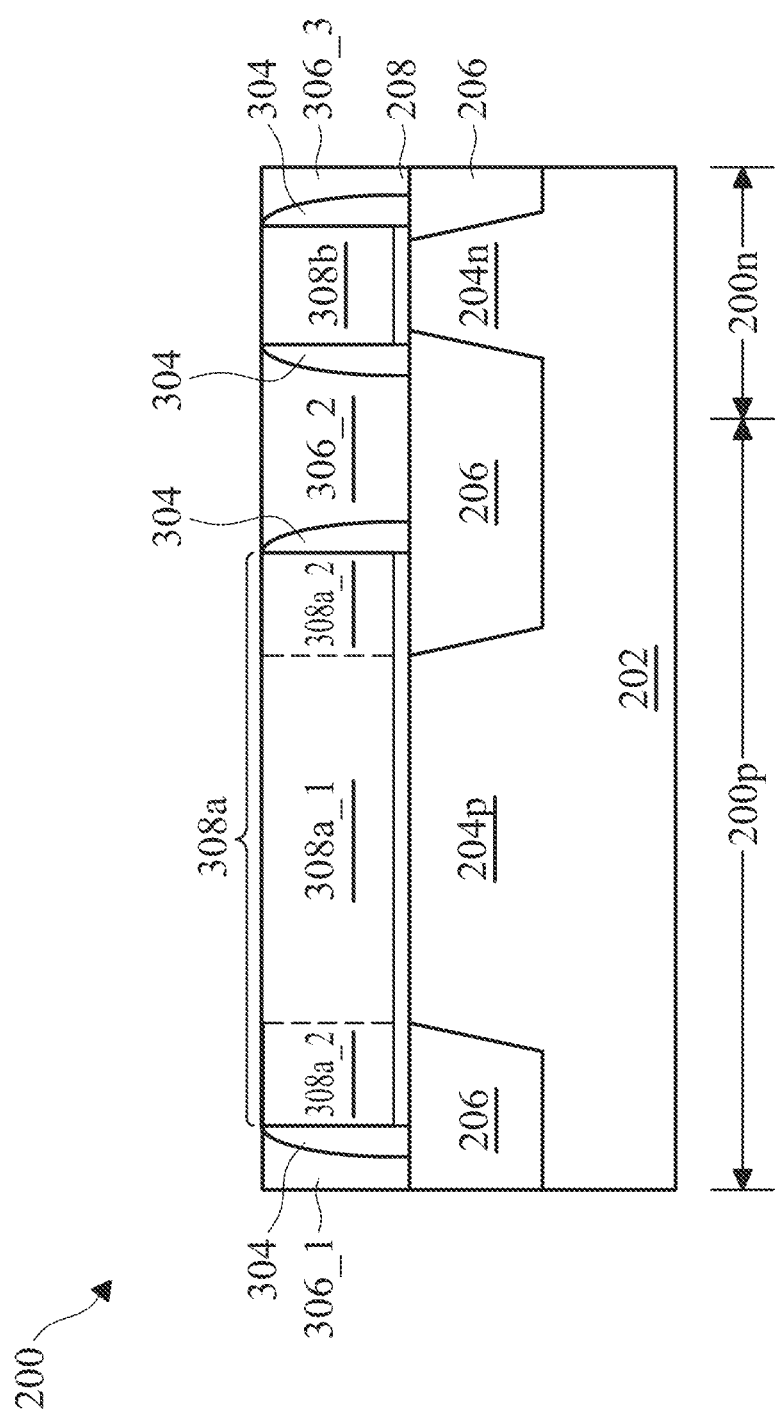

The method 100 in FIG. 1 continues with step 104 in which the structure in FIG. 3B is produced by forming a first dummy strip 308a over the P-active region 204p and isolation region 206 and a second dummy strip 308b over the N-active region 204n in an inter-layer dielectric (ILD) layer 306.

In the present embodiment, a layer of photoresist (not shown) is formed over the dummy gate electrode layer 308 by a suitable process, such as spin-on coating, and patterned to form a patterned photoresist feature over the dummy gate electrode layer 308 by a proper lithography patterning method. In at least one embodiment, a width of the patterned photoresist feature over the P-active region 204p and isolation region 206 is in the range of about 500 to 1000 nm. In another embodiment, a width of the patterned photoresist feature over the N-active region 204n is in the range of about 10 to 30 nm. The patterned photoresist feature can then be transferred using a dry etching process to the dummy gate electrode layer 308 to form a first dummy strip 308a over the P-active region 204p and isolation region 206 and a second dummy strip 308b over the N-active region 204n. The photoresist layer may be stripped thereafter.

It is noted that the CMOS semiconductor device 200 may undergo other "gate last" processes and other CMOS technology processing to form various features of the CMOS semiconductor device 200. As such, the various features are only briefly discussed herein. The various components of the CMOS semiconductor device 200 may be formed prior to formation of the P-metal gate electrode 210p and N-metal gate electrode 210n in a "gate last" process. The various components may comprise p-type and n-type lightly doped source/drain (LDD) regions (not shown) and p-type and n-type source/drain (S/D) regions (not shown) in the active regions 204p, 204n and on opposite sides of the first dummy strip 308a and second dummy strip 308b. The p-type LDD and S/D regions may be doped with B or In, and the n-type LDD and S/D regions may be doped with P or As.

Then, a dielectric layer is formed over the P-active region 204p, N-active region 204n, and isolation region 206 to produce the structure shown in FIG. 3B. The dielectric layer may comprise a single layer or multilayer structure. In at least one embodiment, the dielectric layer is patterned to form gate spacers 304 on opposite sidewalls of the first dummy strip 308a and the second dummy strip 308b. The gate spacers 304 may be formed of silicon oxide, silicon nitride or other suitable materials deposited by a CVD process.

Then, an inter-layer dielectric (ILD) material may be formed over the gate spacers 304, first dummy strip 308a, second dummy strip 308b, and isolation region 206. The ILD layer material may include an oxide formed by a high-aspect-ratio process (HARP) and/or a high-density-plasma (HDP) deposition process. After the ILD layer material deposition, a chemical mechanical polishing (CMP) is performed on the ILD layer material deposition to expose the first dummy strip 308a and second dummy strip 308b.

In the present embodiment, the remaining ILD layer material after performing the CMP process comprises a first portion 306_1 and a second portion 306_2 surrounding the first dummy strip 308a over the P-active region 204p and isolation region 206. In addition, the remaining ILD layer material comprises the second portion 306_2 and a third portion 306_3 surrounding the second dummy strip 308b over the N-active region 204n. Thus, the first dummy strip 308a over the P-active region 204p and isolation region 206 and the second dummy strip 308b over the N-active region 204n together define an ILD layer 306. Further, the first dummy strip 308a comprises a first portion 308a_1 and a second portion 308a_2.

Figure 3C:
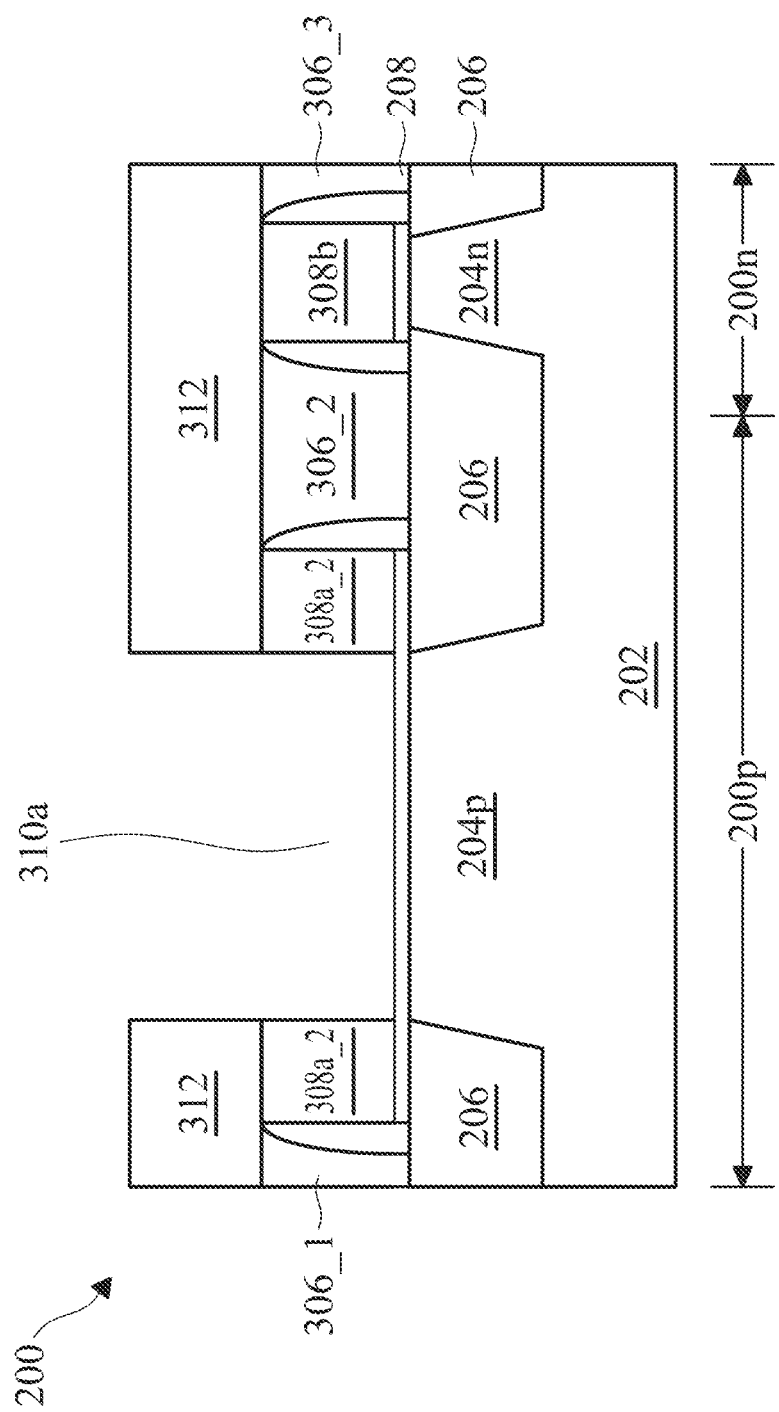

The method 100 in FIG. 1 continues with step 106 in which the structure in FIG. 3C is produced by removing the first portion 308a_1 of the first dummy strip 308a to form a first opening 310a extending over entire length of the P-active region 204a in the ILD layer 306. In the present embodiment, using a patterned photoresist layer 312 as a mask, the first portion 308a_1 of the first dummy strip 308a is removed to form the first opening 310a in the first dummy strip 308a, while a second portion 308a_2 of the first dummy strip 308a, the second dummy strip 308b, and ILD layer 306 are covered by the patterned photoresist layer 312. In the present embodiment, the first opening 310a has the first width $W_1$ in the range of about 500 to 1000 nm.

In at least one embodiment, the first portion 308a_1 of the first dummy strip 308a may be removed using a dry etch process. In at least one embodiment, the dry etch process may be performed under a source power of about 650 to 800 W, a bias power of about 100 to 120 W, and a pressure of about 60 to 200 mTorr, using $Cl_2$, HBr, and/or He as etching gases. The patterned photoresist layer 312 may be stripped thereafter.

It should be noted that the dry etching process for removing the first portion 308a_1 of first dummy strip 308a is especially prone to simultaneously removing a top portion of the ILD layer 306_1/306_2 adjacent to the first dummy strip 308a. Thus, if recesses are generated in the ILD layer 306_1/306_2 after dry etching the first portion 308a_1 of the first dummy strip 308a, the recesses present in the ILD layer 306_1/306_2 can become a receptacle of metals during subsequent processing thereby increasing the likelihood of electrical shorting and/or device failure.

In the present embodiment, the ILD layer 206 is covered and protected by the patterned photoresist layer 312 while removing the first portion 308a_1 of the first dummy strip 308a. The remaining second portion 308a_2 of the first dummy strip 308a adjacent to the ILD layer 306_1/306_2 may further protect the ILD layer 306_1/306_2 during a metal CMP process in next step 108. Accordingly, Applicant's method of fabricating a CMOS semiconductor device 200 may fabricate the gate structure 210 having almost no recess in the ILD layer 306_1/306_2, thereby achieving a perfect isolation between neighboring transistors and thus enhancing the device performance.

Figure 3D:
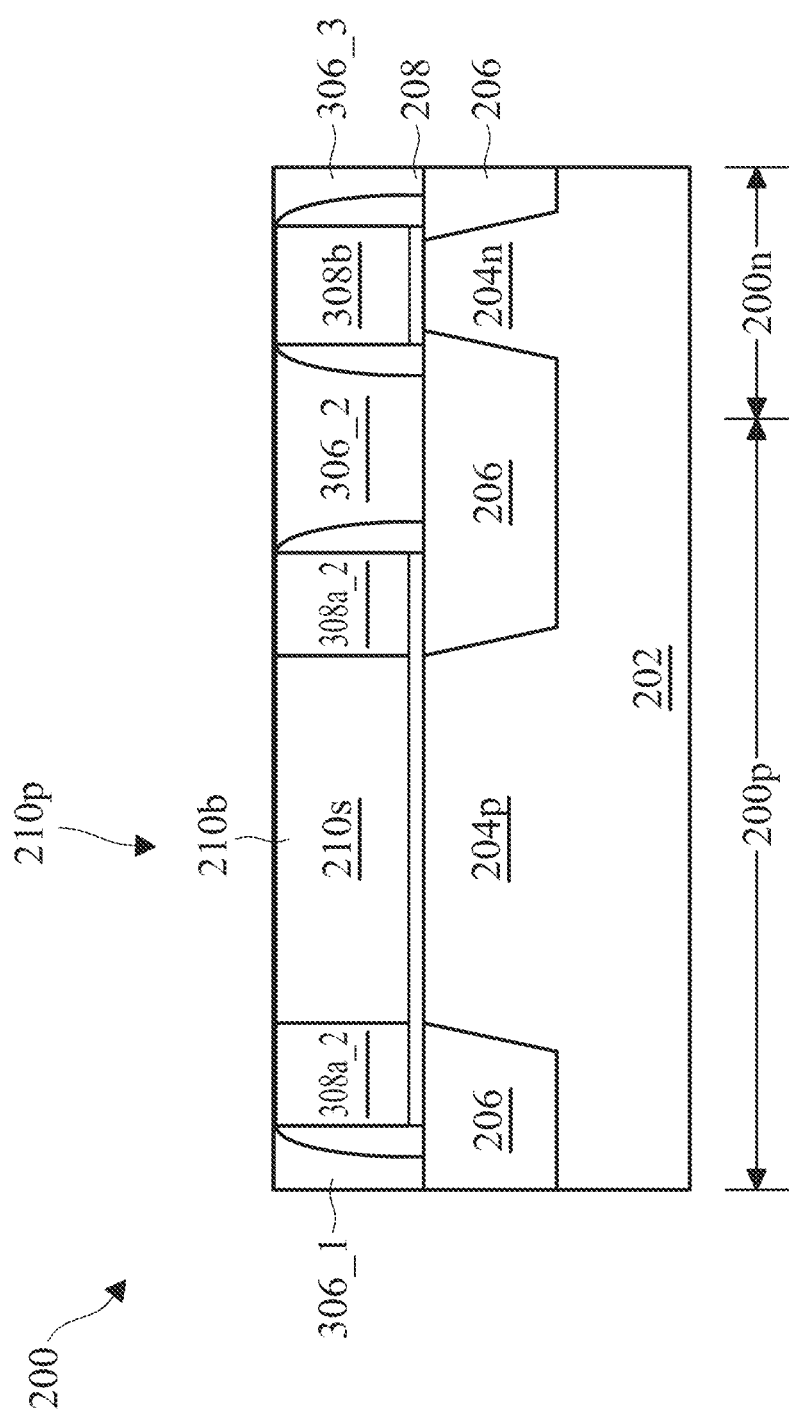

The method 100 in FIG. 1 continues with step 108 in which the structure in FIG. 3D is produced by filling the first opening 310a with the second metal composition 210s. In at least one embodiment, the second metal composition 210s may comprise a P-work-function metal. In some embodiments, the P-work-function metal comprises TiN, WN, TaN, or Ru. The P-work-function metal may be formed by ALD, CVD or other suitable technique. In the present embodiment, the second metal composition 210s is first deposited to substantially fill the first opening 310p. Then, a CMP process is performed to remove a portion of the second metal composition 210s outside of the first opening 310a. Accordingly, the CMP process may stop when reaching the ILD layer 306, and thus providing a substantially planar surface. The remaining second metal composition 210s is referred to as the bulk portion 210b of the P-metal gate electrode 210p.

Figure 3E:
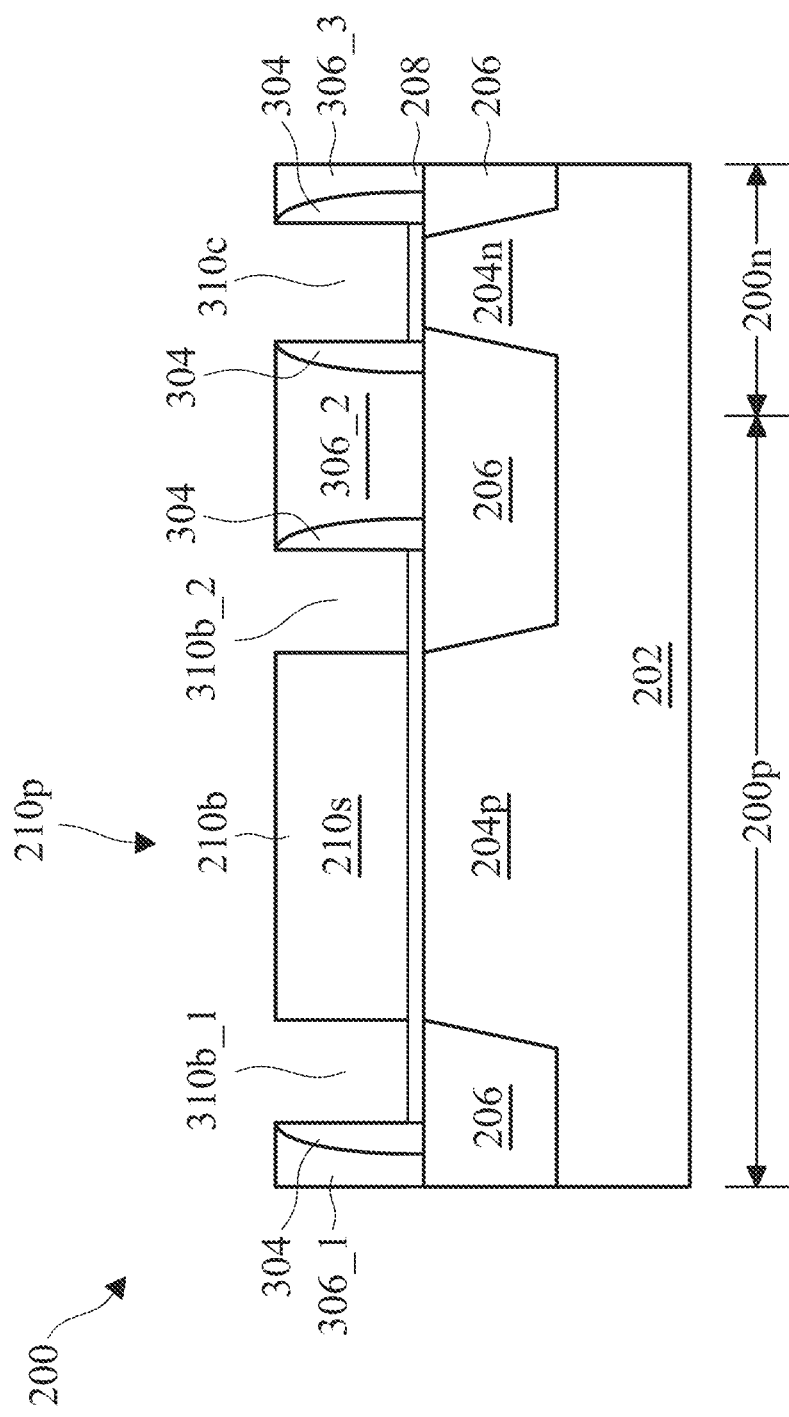

The method 100 in FIG. 1 continues with step 110 in which the structure in FIG. 3E is produced by removing a second portion 308a_2 of the first dummy strip 308a to form a second opening 310b (donated as 310b_1 and 310b_2) over the isolation region 206 and by removing the second dummy strip 308b to form a third opening 310c extending over the entire length of the N-active region 204n in the ILD layer 306.

In the present embodiment, using the gate spacers 304, ILD layer 306 and bulk portion 210b of the P-metal gate electrode 210p as hard masks, the second portion 308a_2 of the first dummy strip 308a and the second dummy strip 308b are simultaneously removed to form the second and third openings 310b, 310c in the ILD layer 306. In at least one embodiment, the second opening 310b has almost the same first width $W_1$ of the first opening 310a. In another embodiment, the third opening 310c has a second width $W_2$ in the range of about 10 to 30 nm, less than the first width $W_1$ of the first opening 310a. A ratio of the first width $W_1$ to the second width $W_2$ is from about 18 to 30.

In some embodiments, the second dummy strip 308b and second portion 308a_2 of the first dummy strip 308a may be removed using a wet etch and/or a dry etch process. In at least one embodiment, the wet etch process includes exposure to a hydroxide solution containing ammonium hydroxide, diluted HF, deionized water, and/or other suitable etchant solutions. In another embodiment, the dry etch process may be performed under a source power of about 650 to 800 W, a bias power of about 100 to 120 W, and a pressure of about 60 to 200 mTorr, using $Cl_2$, HBr and He as etching gases.

Figure 3F:
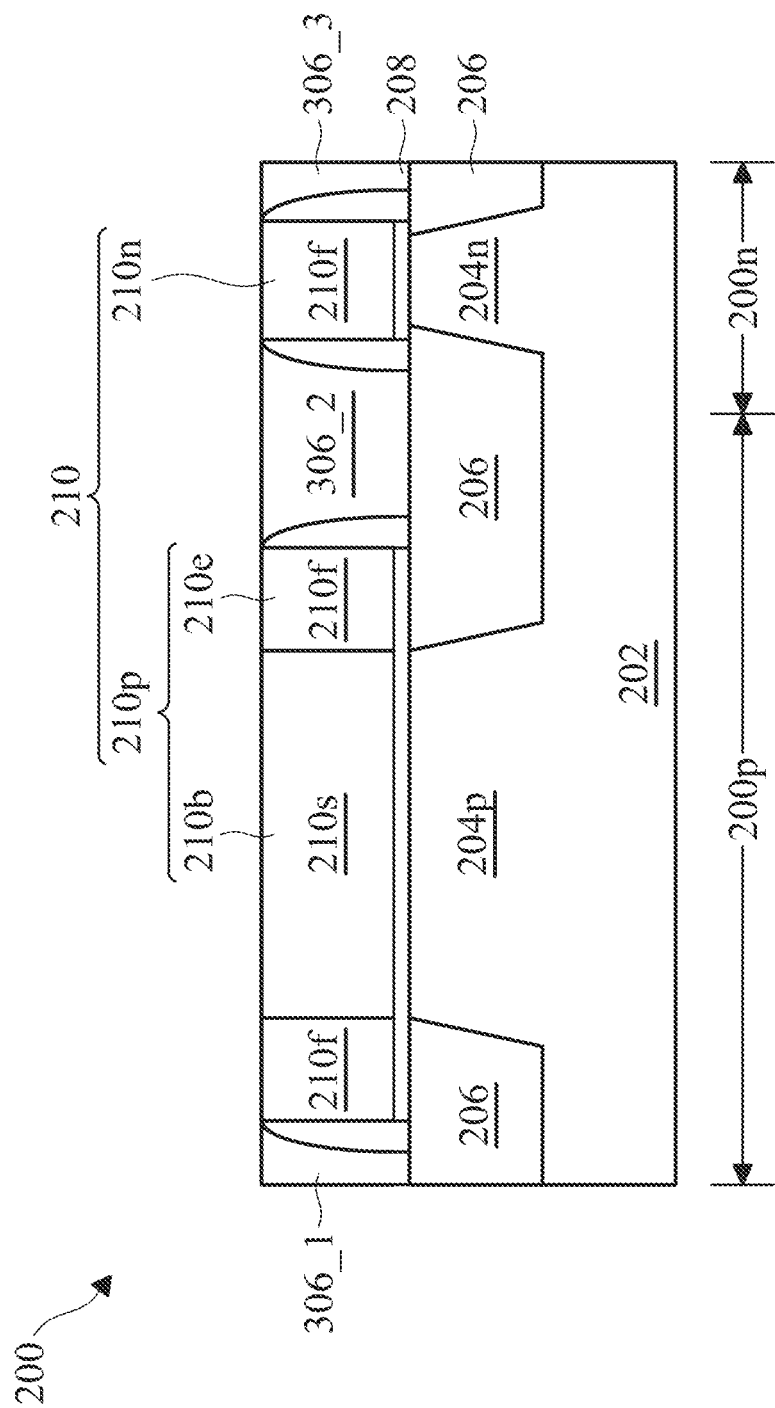

The method 100 in FIG. 1 continues with step 112 in which the structure in FIG. 3F is produced by filling the second and third openings 310b, 310c with the first metal composition 210f. In one embodiment, the first metal composition 210f may comprise an N-work-function metal. In some embodiments, the N-work-function metal comprises Ti, Ag, Al, TiAl, TiAlN, TaC, TaCN, TaSiN, Mn, or Zr. The N-work-function metal may be formed by ALD, PVD, sputtering or other suitable technique. In the present embodiment, the first metal composition 210f is first deposited to substantially fill the second and third openings 310b, 310c. Then, a CMP process is performed to remove a portion of the first metal composition 210f outside of the second and third openings 310b, 310c. Accordingly, the CMP process may stop when reaching the ILD layer 306, and thus providing a substantially planar surface.

In some embodiments, the remaining first metal composition 210f in the second opening 310b over the isolation region 206 is referred to as the endcap portion 210e of the P-metal gate electrode 210p. In the present embodiment, the endcap portion 210e of the P-metal gate electrode 210p has a contact section connected to the bulk portion 210b of the P-metal gate electrode 210p. In the present embodiment, the endcap portion 210e of the P-metal gate electrode 210p and the bulk portion 210b of the P-metal gate electrode 210p are combined and referred to as the P-metal gate electrode 210p. In some embodiments, the remaining first metal composition 210f in the third opening 310c is referred to as the N-metal gate electrode 210n. The P-metal gate electrode 210p and N-metal gate electrode 210n are combined and referred to as a metal gate structure 210.

Figure 4:
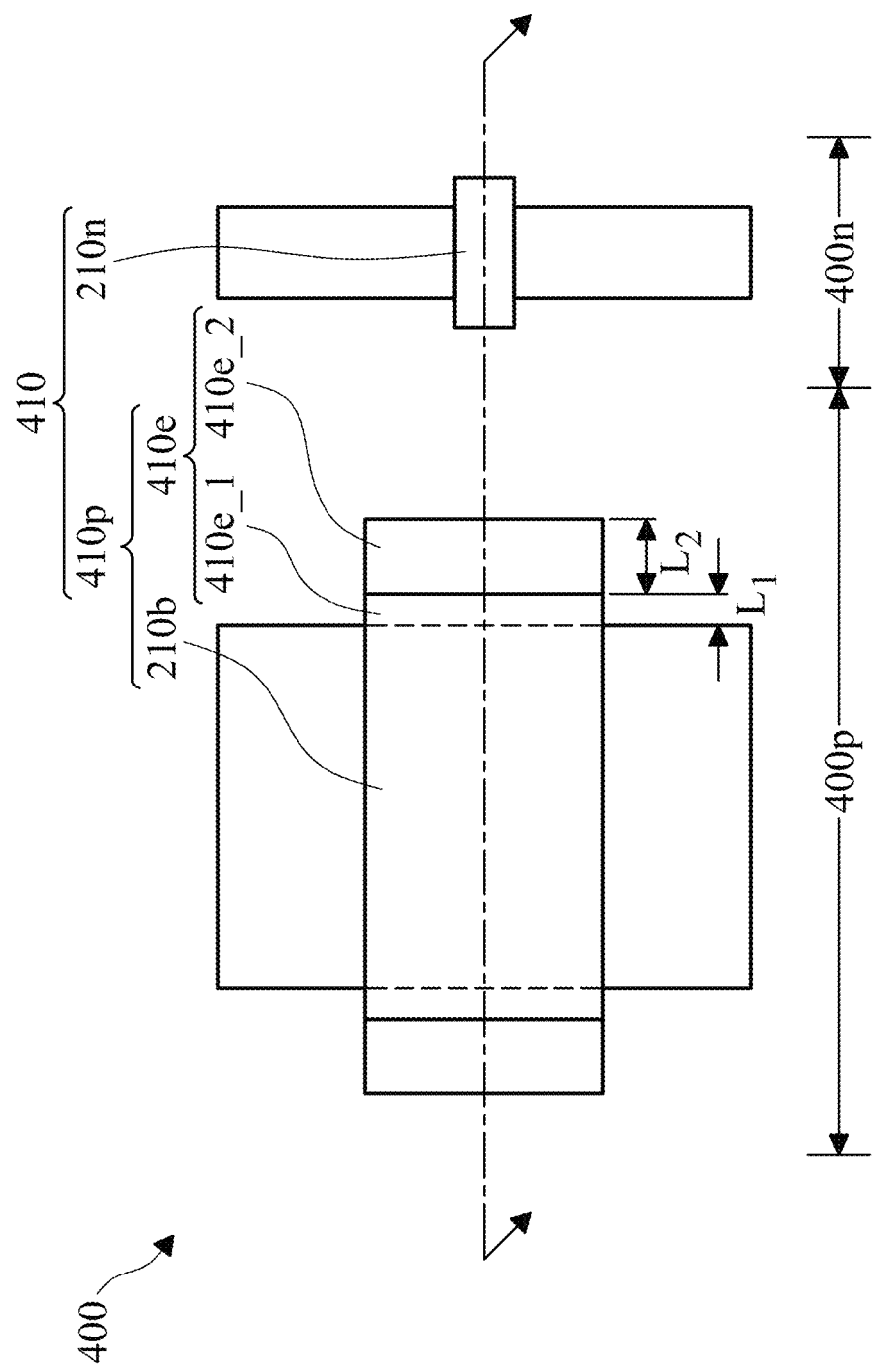
FIG. 4 is a top view of a CMOS semiconductor device comprising a metal gate structure according to various aspects of the present disclosure.

FIG. 4 is a top view of an alternate CMOS semiconductor device 400 comprising a metal gate structure 410 according to various aspects of the present disclosure fabricated using a method comprising the steps shown in FIG. 3A-F, except that the first opening 310a further extends into the isolation region 306 to form an extending portion. Similar features in FIGS. 2 and 4 are numbered the same for the sake of simplicity and clarity. In the present embodiment, the endcap portion 410e comprises a second portion 410e_2 and a first portion 410e_1 between the second portion 410e_2 and the bulk portion 210b, wherein the second portion 410e_2 comprises the first metal composition 210f. A first length $L_1$ of the first portion 410e_1 is equal to or less than a second length $L_2$ of the second portion 410e_2. A ratio of the second length $L_2$ to the first length $L_1$ is from about 1.0 to 1.5.

In the present embodiment, the endcap portion 410e of the P-metal gate electrode 410p and the bulk portion 210b of the P-metal gate electrode 410p are combined and referred to as the P-metal gate electrode 410p. The P-metal gate electrode 410p and N-metal gate electrode 210n are combined and referred to as a metal gate structure 410.

It is understood that the CMOS semiconductor devices 200, 400 may undergo further CMOS processes to form various features such as contacts/vias, interconnect metal layers, dielectric layers, passivation layers, etc.

Aspects of the present disclosure relate to a semiconductor device which includes a substrate including an isolation region surrounding a P-active region and an N-active region; a first gate electrode including a first metal composition over the N-active region; and a second gate electrode with a center portion over the P-active region and an endcap portion over the isolation region, wherein the endcap portion has the first metal composition, the center portion has a second metal composition different from the first metal composition, the center portion and the endcap portion do not overlap, and an inner sidewall of the endcap portion is substantially aligned with a sidewall of the isolation region. In some embodiments, the endcap portion includes a first portion over the isolation region at a first side of the center portion, and a second portion over the isolation region over the isolation region at a second side of the center portion opposite from the first side of the center portion, and the first portion of the endcap portion is between the center portion and the second portion of the endcap portion. In some embodiments, a first width of the second gate electrode is greater than a second width of the first gate electrode. In some embodiments, a ratio of the first width to the second width ranges from about 18 to about 30. In some embodiments, the first metal composition includes an N-work-function metal. In some embodiments, the first metal composition includes at least one of Ti, Ag, Al, TiAl, TiAlN, TaC, TaCN, TaSiN, Mn, or Zr. In some embodiments, the P-active region includes a source region and a drain region on opposite sides of the center portion. In some embodiments, the semiconductor device includes a first type of lightly doped source/drain (LDD) regions in the N-active region, wherein the first type of LDD regions and the N-active region have the same type of dopants; and a second type LDD regions in the P-active region, wherein the second type of LDD regions and the P-active region have the same type of dopants, different from the first type of dopants. In some embodiments, the second metal composition includes a P-work-function metal. In some embodiments, the second metal composition includes at least one of TiN, WN, TaN, or Ru.

Aspects of the present disclosure relate to a semiconductor device which includes a substrate; a first well region in the substrate, the first well region having a first conductivity type; a second well region in the substrate, the second well region having a second conductivity type;

a dielectric material in the substrate between the first well region and the second well region; a first gate electrode which includes a first metal composition over the second well region; and a second gate electrode which includes a center portion over the first well region and an endcap portion over the dielectric material, wherein the endcap portion includes the first metal composition, the center portion includes a second metal composition different from the first metal composition, a bottom of the center portion and a bottom of the endcap portion are substantially coplanar, and an inner sidewall of the endcap portion is substantially aligned with a sidewall of the dielectric material. In some embodiments, the center portion extends over an entire length of the first well region. In some embodiments, the endcap portion includes a first portion over the isolation region at a first side of the center portion, and a second portion at a second side over the isolation region at a second side of the center portion opposite form the first side of the center portion, and the first portion of the endcap portion is positioned between the center portion and the second portion of the endcap portion. In some embodiments, the first gate electrode extends over an entire length of the second well region. In some embodiments, a first width of the second gate electrode is greater than a second width of the first gate electrode. In some embodiments, a sidewall of the center portion is substantially aligned with a sidewall of the first well region.

Aspects of the present disclosure relate to a semiconductor device which includes a substrate; a first active region in the substrate, the first active region having a first conductivity type; a second active region in the substrate, the second active region having a second conductivity type; a dielectric material in the substrate surrounding the first active region and the second active region; a first gate electrode which includes a first conductive material over the second active region, wherein the first gate electrode has a width extending beyond a periphery of the second active region; and a second gate electrode which includes a center portion substantially aligned with the first active region in a direction of a channel and an endcap portion over the dielectric material abutting the center portion, wherein the endcap portion includes the first conductive material, the center portion includes a second conductive material different from the first conductive material, and an interface between the center portion and the endcap portion is substantially aligned with an interface between the second active region and the dielectric material. In some embodiments, the endcap portion includes a first portion over the dielectric material at a first side of the center portion of the second gate electrode, and a second portion over the dielectric material at a second side of the center portion of the second gate electrode opposite from the first side of the center portion. In some embodiments, a width of the center portion is greater than a width of the first gate electrode. In some embodiments, the first gate electrode is separated from the endcap portion of the second gate electrode by a second dielectric material over the dielectric material.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device comprising:
   a substrate comprising an isolation region surrounding a P-active region and an N-active region;
   a first gate electrode comprising a first metal composition over the N-active region; and
   a second gate electrode comprising a center portion over the P-active region and an endcap portion over the isolation region, wherein the endcap portion comprises the first metal composition, the center portion comprises a second metal composition different from the first metal composition, the center portion and the endcap portion do not overlap, and an inner sidewall of the endcap portion is substantially aligned with a sidewall of the isolation region.

2. The semiconductor device of claim 1, wherein the endcap portion comprises a first portion over the isolation region at a first side of the center portion, and a second portion over the isolation region over the isolation region at a second side of the center portion opposite from the first side of the center portion, and the first portion of the endcap portion is between the center portion and the second portion of the endcap portion.

3. The semiconductor device of claim 1, wherein a first width of the second gate electrode is greater than a second width of the first gate electrode.

4. The semiconductor device of claim 3, wherein a ratio of the first width to the second width ranges from about 18 to about 30.

5. The semiconductor device of claim 1, wherein the first metal composition comprises an N-work-function metal.

6. The semiconductor device of claim 1, wherein the first metal composition comprises at least one of Ti, Ag, Al, TiAl, TiAlN, TaC, TaCN, TaSiN, Mn, or Zr.

7. The semiconductor device of claim 1, wherein the P-active region comprise a source region and a drain region on opposite sides of the center portion.

8. The semiconductor device of claim 1, further comprising:
   a first type of lightly doped source/drain (LDD) regions in the N-active region, wherein the first type of LDD regions and the N-active region have the same type of dopants; and
   a second type LDD regions in the P-active region, wherein the second type LDD regions and the P-active region have the same type of dopants, different from the first type of dopants.

9. The semiconductor device of claim 1, wherein the second metal composition comprises a P-work-function metal.

10. The semiconductor device of claim 1, wherein the second metal composition comprises at least one of TiN, WN, TaN, or Ru.

11. A semiconductor device, comprising:
    a substrate;
    a first well region in the substrate, the first well region having a first conductivity type;
    a second well region in the substrate, the second well region having a second conductivity type;
    a dielectric material in the substrate between the first well region and the second well region;
    a first gate electrode comprising a first metal composition over the second well region; and
    a second gate electrode comprising a center portion over the first well region and an endcap portion over the dielectric material, wherein the endcap portion comprises the first metal composition, the center portion comprises a second metal composition different from the first metal composition, a bottom of the center portion and a bottom of the endcap portion are substantially coplanar, and an inner sidewall of the endcap portion is substantially aligned with a sidewall of the dielectric material.

12. The semiconductor device of claim 11, wherein the center portion extends over an entire length of the first well region.

13. The semiconductor device of claim 12, wherein the endcap portion comprises a first portion over the dielectric material at a first side of the center portion, and a second portion at a second side over the dielectric material at a second side of the center portion opposite form the first side of the center portion, and the first portion of the endcap portion is positioned between the center portion and the second portion of the endcap portion.

14. The semiconductor device of claim 11, wherein the first gate electrode extends over an entire length of the second well region.

15. The semiconductor device of claim 11, wherein a first width of the second gate electrode is greater than a second width of the first gate electrode.

16. The semiconductor device of claim 11, wherein a sidewall of the center portion is substantially aligned with a sidewall of the first well region.

17. A semiconductor device, comprising:
    a substrate;
    a first active region in the substrate, the first active region having a first conductivity type;
    a second active region in the substrate, the second active region having a second conductivity type;
    a dielectric material in the substrate surrounding the first active region and the second active region;

a first gate electrode comprising a first conductive material over the second active region, wherein the first gate electrode has a width extending beyond a periphery of the second active region; and a second gate electrode comprising a center portion substantially aligned with the first active region in a direction of a channel and an endcap portion over the dielectric material abutting the center portion, wherein the endcap portion comprises the first conductive material, the center portion comprises a second conductive material different from the first conductive material, and an interface between the center portion and the endcap portion is substantially aligned with an interface between the second active region and the dielectric material.

18. The semiconductor device of claim 17, wherein the endcap portion comprises a first portion over the dielectric material at a first side of the center portion of the second gate electrode, and a second portion over the dielectric material at a second side of the center portion of the second gate electrode opposite from the first side of the center portion.

19. The semiconductor device of claim 17, wherein a width of the center portion is greater than a width of the first gate electrode.

20. The semiconductor device of claim 19, wherein the first gate electrode is separated from the endcap portion of the second gate electrode by a second dielectric material over the dielectric material.

* * * * *